United States Patent
Jiang et al.

(10) Patent No.: US 10,861,868 B2
(45) Date of Patent: Dec. 8, 2020

(54) METHODS FOR FORMING STRUCTURALLY-REINFORCED SEMICONDUCTOR PLUG IN THREE-DIMENSIONAL MEMORY DEVICE

(71) Applicant: YANGTZE MEMORY TECHNOLOGIES CO., LTD., Wuhan (CN)

(72) Inventors: Yangbo Jiang, Wuhan (CN); Liang Hui Wu, Wuhan (CN); Ya Jun Wang, Wuhan (CN); Jingping Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 8 days.

(21) Appl. No.: 16/140,468

(22) Filed: Sep. 24, 2018

(65) Prior Publication Data
US 2020/0058674 A1    Feb. 20, 2020

Related U.S. Application Data

(63) Continuation of application No. PCT/CN2018/100824, filed on Aug. 16, 2018.

(51) Int. Cl.
*H01L 27/11582* (2017.01)
*H01L 21/768* (2006.01)
*H01L 27/1157* (2017.01)

(52) U.S. Cl.
CPC .. *H01L 27/11582* (2013.01); *H01L 21/76802* (2013.01); *H01L 21/76897* (2013.01); *H01L 27/1157* (2013.01)

(58) Field of Classification Search
CPC .............. H01L 27/11582; H01L 27/11556
See application file for complete search history.

(56) References Cited

U.S. PATENT DOCUMENTS

2006/0011586 A1* 1/2006 Shea ................. H01L 21/31111
216/95
2007/0042564 A1* 2/2007 Yoon ................. H01L 21/76232
438/424
(Continued)

FOREIGN PATENT DOCUMENTS

CN      102456675 A      5/2012
CN      105097817 A      11/2015
(Continued)

OTHER PUBLICATIONS

International Search Report issued in corresponding International Application No. PCT/CN2018/100824, dated May 15, 2019, 4 pages.
(Continued)

*Primary Examiner* — Alia Sabur
(74) *Attorney, Agent, or Firm* — Bayes PLLC

(57) ABSTRACT

Embodiments of 3D memory devices with a structurally-reinforced semiconductor plug and methods for forming the same are disclosed. In an example, a method for forming a 3D memory device is disclosed. A dielectric stack is formed on a substrate. The dielectric stack includes a plurality of interleaved dielectric layers and sacrificial layers. An opening extending vertically through the dielectric stack is formed. A shallow recess is formed by removing a part of a sacrificial layer abutting a sidewall of the opening. The sacrificial layer is at a lower portion of the dielectric stack. A semiconductor plug is formed at a lower portion of the opening. A part of the semiconductor plug protrudes into the shallow recess. A channel structure is formed above and in contact with the semiconductor plug in the opening. A memory stack including a plurality of conductor/dielectric layer pairs is formed by replacing, with a plurality of conductor layers, the sacrificial layers in the dielectric stack.

20 Claims, 12 Drawing Sheets

(56) References Cited

U.S. PATENT DOCUMENTS

| | | | |
|---|---|---|---|
| 2011/0199804 A1 | 8/2011 | Son et al. | |
| 2012/0001345 A1 | 1/2012 | Park et al. | |
| 2015/0104916 A1 | 4/2015 | Lee et al. | |
| 2015/0318300 A1 | 11/2015 | Ohsaki | |
| 2016/0133638 A1 | 5/2016 | Simsek-Ege et al. | |
| 2016/0225786 A1 | 8/2016 | Lee et al. | |
| 2016/0365351 A1 | 12/2016 | Nishikawa et al. | |
| 2017/0098659 A1 | 4/2017 | Yoshimizu et al. | |
| 2017/0133400 A1 | 5/2017 | Yoo et al. | |
| 2017/0243879 A1* | 8/2017 | Yu | H01L 27/1157 |
| 2018/0083027 A1 | 3/2018 | Yamabe et al. | |
| 2019/0096904 A1* | 3/2019 | Noguchi | H01L 27/11575 |

FOREIGN PATENT DOCUMENTS

| | | | |
|---|---|---|---|
| CN | 106876397 A | 6/2017 | |
| CN | 107591320 A | 1/2018 | |
| CN | 107731741 A | 2/2018 | |
| TW | 201820431 A | 6/2018 | |
| WO | 2018144957 A1 | 8/2018 | |

OTHER PUBLICATIONS

Written Opinion of the International Searching Authority issued in corresponding International Application No. PCT/CN2018/100824, dated May 15, 2019, 5 pages.

\* cited by examiner

METHODS FOR FORMING STRUCTURALLY-REINFORCED SEMICONDUCTOR PLUG IN THREE-DIMENSIONAL MEMORY DEVICE

CROSS REFERENCE TO RELATED APPLICATION

This application is continuation of International Application No. PCT/CN2018/100824, filed on Aug. 16, 2018, entitled "METHODS FOR FORMING STRUCTURALLY-REINFORCED SEMICONDUCTOR PLUG IN THREE-DIMENSIONAL MEMORY DEVICE," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with a structurally-reinforced semiconductor plug and methods for forming the same are disclosed herein.

In one example, a method for forming a 3D memory device is disclosed. A dielectric stack is formed on a substrate. The dielectric stack includes a plurality of interleaved dielectric layers and sacrificial layers. An opening extending vertically through the dielectric stack is formed. A shallow recess is formed by removing a part of a sacrificial layer abutting a sidewall of the opening. The sacrificial layer is at a lower portion of the dielectric stack. A semiconductor plug is formed at a lower portion of the opening. A part of the semiconductor plug protrudes into the shallow recess. A channel structure is formed above and in contact with the semiconductor plug in the opening. A memory stack including a plurality of conductor/dielectric layer pairs is formed by replacing, with a plurality of conductor layers, the sacrificial layers in the dielectric stack.

In another example, a method for forming a semiconductor structure is disclosed. A plurality of interleaved dielectric layers and sacrificial layers are formed on a substrate. An opening extending vertically through the interleaved dielectric layers and sacrificial layers is formed. A shallow recess is formed by removing a part of one of the sacrificial layers abutting a sidewall of the opening. A semiconductor plug is formed at a lower portion of the opening. A part of the semiconductor plug protrudes into the shallow recess. The protruding part of the semiconductor plug is trimmed such that a lateral dimension of the semiconductor plug becomes substantially the same along a vertical direction.

In a different example, a 3D memory device includes a substrate, a memory stack disposed on the substrate and including a plurality of conductor/dielectric layer pairs, and a plurality of memory strings each extending vertically through the memory stack and including a semiconductor plug at a bottom portion of the memory string. A lateral dimension of the semiconductor plug is substantially the same along a vertical direction.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
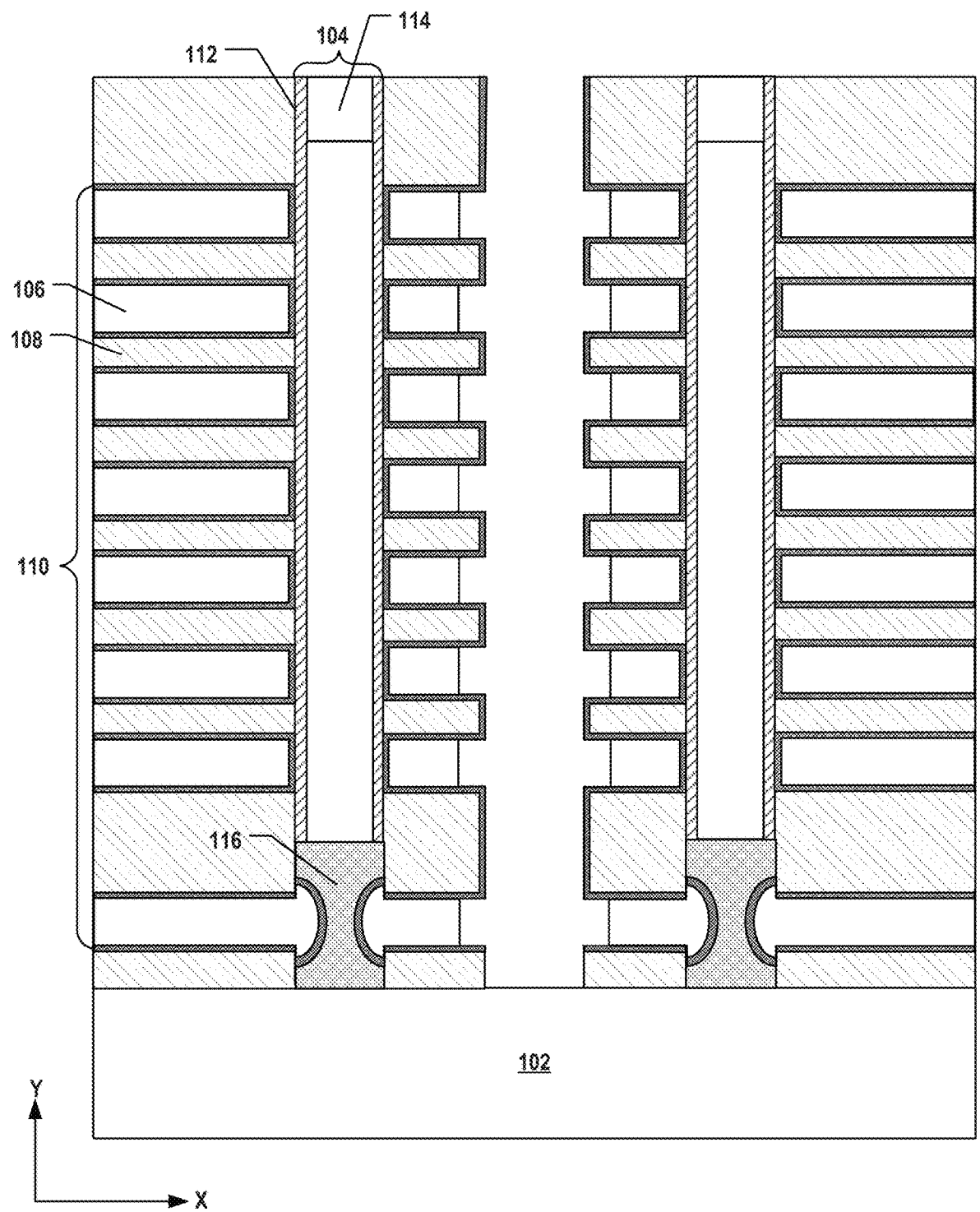
FIG. 1 illustrates a cross-section of an exemplary 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a semiconductor plug is typically formed at one end of a NAND memory string. The semiconductor plug acts as a channel of a transistor when combined with a gate conductor layer formed surrounding it. For example, a semiconductor plug is firstly formed with a lateral dimension approximating that of a NAND memory string. However, the semiconductor plug is later on subject to some additional etching process (e.g., parts of the gate replacement process). The sidewall profile of the semiconductor plug thus changes from straight lines to concave curves. To a lesser extent, the structurally-weakened semiconductor plug may shift the turn-on voltage of the transistor. To a greater extent, the structurally-weakened semiconductor plug may collapse, destroying the entire block of the 3D memory cells. The negative impact of a structurally-weakened semiconductor plug can cause loss in yield and reliability of a 3D memory device.

Various embodiments in accordance with the present disclosure provide fabrication methods of a 3D memory device having a structurally-reinforced semiconductor plug. By forming protruding parts on the semiconductor plug at an early stage and etching the same parts at a later stage, the semiconductor plug can retain its uniform lateral dimension at the end of the fabrication process. The above-noted drawbacks caused by existing fabrication flow can thus be overcome, and the yield and reliability of the 3D memory device can be improved.

One step of forming a structurally-reinforced plug is to prepare a special "mold" within which the semiconductor plug can grow. In some embodiments, the mold is first formed by cutting a hole vertically extending through a dielectric stack (which includes a plurality of interleaved dielectric layers and sacrificial layers) on a substrate. At this point, the mold has a straight sidewall profile. Next, the mold can be rinsed with certain types of cleaning solutions such that the sidewall profile is further adjusted. In some embodiments, the cleaning solutions include a mixture of hydrofluoric acid and ozone such that the etching rate on the sacrificial layers is higher than that on the dielectric layers. As a result, shallow recesses can be formed laterally out of the original mold. At this point, the mold can have a corrugated sidewall profile. Finally, by filling the specially-designed mold with semiconductor materials including polycrystalline silicon (polysilicon), a semiconductor plug with protruding parts is thus formed. The protruding parts can act as the buffer that compensates for the sidewall profile change in the later steps of gate replacement and thus, improve the final sidewall profile of the semiconductor plug in the 3D memory device.

FIG. 1 illustrates a cross-section of an exemplary 3D memory device 100 with a structurally-weaken semiconductor plug 116. Semiconductor plug 116 can include a non-uniform lateral dimension along the vertical direction, as a result of over etching on its sidewall. It is noted that x and y axes are included in FIG. 1 to further illustrate the spatial relationship of the components in 3D memory device 100. A substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 102) in the y-direction (i.e., the vertical direction) when the substrate is positioned in the lowest plane of the semiconductor device in the y-direction. The same notion for describing spatial relationship is applied throughout the present disclosure.

3D memory device 100 can be a NAND Flash memory device in which memory cells are provided in the form of an array of NAND memory strings 104 extending vertically above substrate 102. In some embodiments, 3D memory device 100 includes NAND memory strings 104 that extend through a plurality of pairs each including a conductor layer 106 and a dielectric layer 108 (referred to herein as "conductor/dielectric layer pairs"). The stacked conductor/dielectric layer pairs are also referred to herein as a "memory stack" 110. In some embodiments, each NAND memory string 104 includes a channel structure 112 extending vertically through memory stack 110. NAND memory string 104, according to some embodiments, further includes two semiconductor plugs 114 and 116 each at a respective end in the y-direction. Moreover, both semiconductor plugs 114 and 116 can be in contact with channel structure 112. As shown in FIG. 1, semiconductor plug 116 at the lower end of NAND memory string 104 has a non-uniform lateral dimension (e.g., thinner at the middle) in the vertical direction and thus, may lose its electrical contact to channel structure 112. It is possible that the thinnest of portion semiconductor plug 116 may become too weak to support any other structures sitting above, causing them to collapse altogether.

Figure 2:
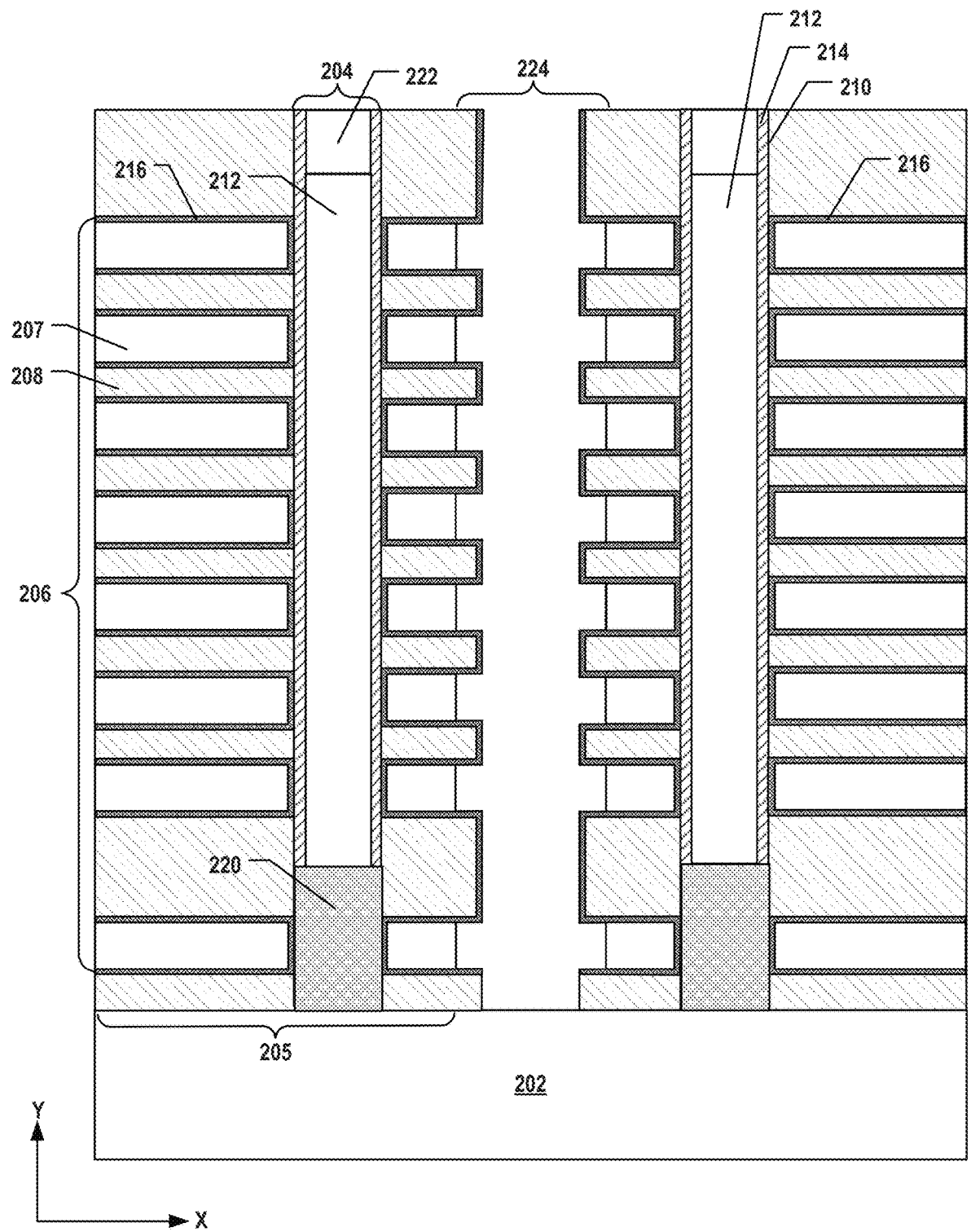
FIG. 2 illustrates a cross-section of an exemplary 3D memory device having a structurally-reinforced semiconductor plug, according to some embodiments of the present disclosure.

In contrast, a 3D memory device with a structurally-reinforced semiconductor plug does not share the same issues as described above with reference to FIG. 1. FIG. 2 illustrates a cross-section of an exemplary 3D memory device 200 having a structurally-reinforced semiconductor plug 220, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, wet/dry etching, chemical mechanical polishing (CMP), or any combination thereof.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of array of NAND memory strings 204 extending vertically above substrate 202. The memory array device can include NAND memory strings 204 that extend through a plurality of pairs each including a conductor layer 207 and a dielectric layer 208 (referred to herein as "conductor/dielectric layer pairs"). The stacked conductor/dielectric layer pairs are also referred to herein as a "memory stack" 206. The number of the conductor/dielectric layer pairs in memory stack 206 (e.g., 32, 64, 96, or 128) can set the number of memory cells in 3D memory device 200. Conductor layers 207 and dielectric layers 208 in memory stack 206 can alternate in the vertical direction. In other words, except the ones at the top and the bottom of memory stack 206, each conductor layer 207 can be adjoined by two dielectric layers 208 on both sides, and each dielectric layer 208 can be adjoined by two conductor layers 207 on both sides. Conductor layers 207 can each have the same thickness or have different thicknesses. Similarly, dielectric layers 208 can each have the same thickness or have different thicknesses. Conductor layers 207 can include conductive materials including, but not limited to, W, cobalt (Co), copper (Cu), aluminum (Al), polysilicon, doped silicon, silicides, or any combination thereof. Dielectric layers 208 can include dielectric materials including, but not limited to, silicon oxide, silicon nitride, silicon oxynitride, or any combination thereof.

As shown in FIG. 2, each NAND memory string 204 can include a channel structure 210 extending vertically through memory stack 206. Channel structure 210 can include a channel hole filled with semiconductor material(s) (e.g., as a semiconductor channel 212) and dielectric material(s) (e.g., as a memory film 214). In some embodiments, semiconductor channel 212 includes silicon, such as amorphous silicon, polysilicon, or single crystalline silicon. In some embodiments, memory film 214 is a composite layer including a tunneling layer, a storage layer (also known as a "charge trap/storage layer"), and a blocking layer. Each NAND memory string 204 can have a cylinder shape (e.g., a pillar shape). Semiconductor channel 212, the tunneling layer, the storage layer, and the blocking layer are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high-k dielectrics, or any combination thereof. In one example, the blocking layer can include a composite layer of silicon oxide/silicon oxynitride/silicon oxide (ONO).

In some embodiments, NAND memory strings 204 and memory stack 206 collectively form NAND memory cell stacks 205. Conductor layer 207 (each being part of a word line) in memory stack 206 can function as a gate conductor of memory cells in NAND memory cell stack 205. Conductor layer 207 can include multiple control gates of multiple NAND memory cell stacks 205 and can extend laterally as a word line ending at the edge of memory stack 206 (e.g., in a staircase structure of memory stack 206). In some embodiments, NAND memory cell stack 205 further includes a gate dielectric layer 216 disposed laterally between conductor layer 207 and memory film 214. Gate dielectric layer 216 can increase the gate capacitance of each memory cell, as well as suppress the leakage current from one gate to its neighboring gates due to its all-around coverage on the control gate. Gate dielectric layer 216 can include materials including, but not limited to, silicon nitride, high-k dielectrics, such as aluminum oxide ($Al_2O_3$), hafnium oxide ($HfO_2$), tantalum oxide ($Ta_2O_5$), or any combination thereof. In some embodiments, NAND memory cell stack 205 includes conductor layers 207 (as the gate conductors of memory cell transistors) made from tungsten, glue layers (not shown) including titanium/titanium nitride (Ti/TiN) or tantalum/tantalum nitride (Ta/TaN), gate dielectric layers 216 made from a high-k dielectric material, and channel structures 210.

In some embodiments, NAND memory string 204 includes two semiconductor plugs 220 and 222 each at a respective end in the vertical direction. Each of semiconductor plugs 220 and 222 can be in contact with a respective end of channel structure 210. Semiconductor plug 220 can be at the lower end (bottom portion) of NAND memory string 204 and in contact with channel structure 210 (e.g., on the lower end of channel structure 210) and substrate 202. As used herein, the "upper end" of a component (e.g., NAND memory string 204) is the end farther away from substrate 202 in the y-direction, and the "lower end" of the component (e.g., NAND memory string 204) is the end closer to substrate 202 in the y-direction when substrate 202 is positioned in the lowest plane of 3D memory device 200. Semiconductor plug 220 can include a semiconductor material, such as silicon, which is epitaxially grown from substrate 202. It is understood that in some embodiments, semiconductor plug 220 includes single crystalline silicon that is part of substrate 202. In other words, semiconductor plug 220 can include an epitaxially-grown semiconductor layer that is the same as the material of substrate 202. Semiconductor plug 220 can function as a channel controlled by a source select gate of NAND memory string 204.

Semiconductor plug 222 can be at the upper end of NAND memory string 204 and in contact with channel structure 210 (e.g., on the upper end of channel structure 210). Semiconductor plug 222 can include semiconductor materials (e.g., polysilicon) or conductive materials (e.g., metals). In some embodiments, semiconductor plug 222 includes an opening filled with Ti/TiN or Ta/TaN as a glue layer and tungsten as a conductor. By covering the upper end of channel structure 210 during the fabrication of 3D memory device 200, semiconductor plug 222 can function as an etch stop layer to prevent etching of dielectrics filled in channel structure 210, such as silicon oxide and silicon nitride. In some embodiments, semiconductor plug 222 also functions as the drain of NAND memory string 204.

As shown in FIG. 2, 3D memory device 200 further includes slit structures 224. Each slit structure 224 can extend vertically through memory stack 206. Slit structure 224 can also extend laterally to separate memory stack 206 into multiple blocks. Slit structure 224 can include an opening (slit) that provides access for the chemical precursor to form conductor layer 207. Slit structure 224 can include a slit contact (not shown), formed by filling the slit with conductive materials including, but not limited to, W, Co, Cu, Al, polysilicon, silicides, or any combination thereof.

Different from FIG. 1 in which semiconductor plug 116 has a curved sidewall profile due to over-etching, as shown in FIG. 2, semiconductor plug 220 has a substantially straight sidewall profile obtained by the novel fabrication methods disclosed herein. The lateral dimension of semiconductor plug 220 can be substantially the same along the vertical direction (the y-direction). In some embodiments, the variation of the lateral dimension of semiconductor plug 220 along the vertical direction is less than about 25%, such as between 0% and 25% (e.g., 0%, 5%, 10%, 15%, 20%, 25%, any range bounded by the lower end by any of these values, or in any range defined by any two of these values). In some embodiments, the lateral dimension of semiconductor plug 220 is substantially the same as that of channel structure 210. That is, NAND memory string 204 can have a substantially uniform lateral dimension from top to bottom.

Figure 3A:
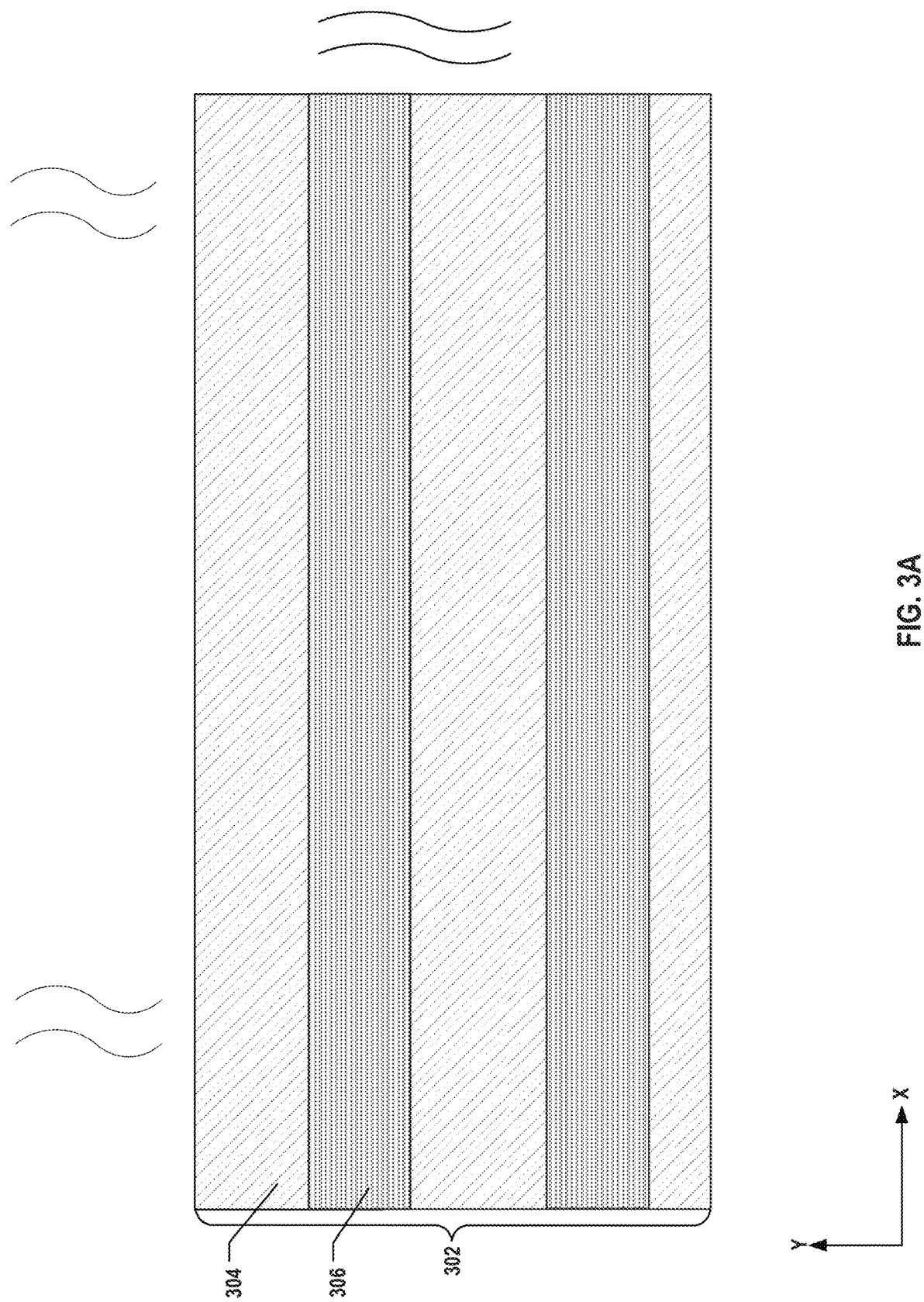
FIGS. 3A-3G illustrate an exemplary fabrication process for forming a 3D memory device having a structurally-reinforced semiconductor plug, according to some embodiments of the present disclosure.
Figure 3B:
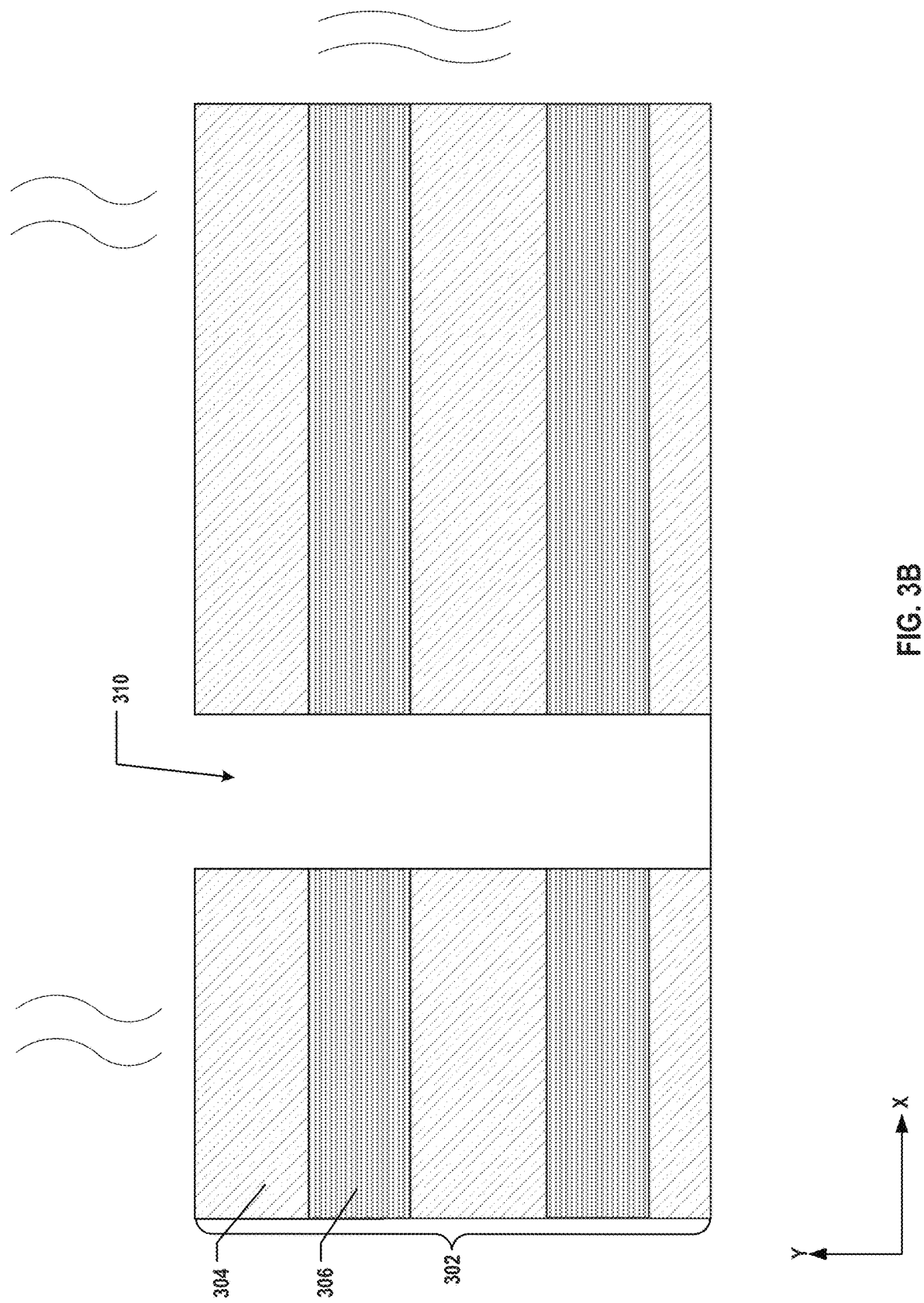

FIGS. 3A-3G illustrate an exemplary fabrication process for forming a 3D memory device having a structurally-reinforced semiconductor plug, according to some embodiments of the present disclosure. FIG. 4 is a flowchart of an exemplary method 400 for forming a 3D memory device having a structurally-reinforced semiconductor plug, according to some embodiments of the present disclosure. Examples of the 3D memory device depicted in FIGS. 3-4 include 3D memory devices 200 depicted in FIG. 2. FIGS. 3-4 will be described together. It is understood that the operations shown in method 400 are not exhaustive and that other operations can be performed as well before, after, or between any of the illustrated operations. Further, some of the operations may be performed simultaneously, or in a different order than shown in FIGS. 3-4.

Referring to FIG. 4, method 400 starts at operation 402, in which a dielectric stack is formed on a substrate. The substrate can be a silicon substrate. The dielectric stack can include a plurality of dielectric/sacrificial layer pairs. As illustrated in FIG. 3A, the bottom portion of a dielectric stack 302 is given in a close-up view. Pairs of a first dielectric layer 304 and a second dielectric layer (known as a "sacrificial layer") 306 (together referred to herein as "dielectric layer pairs") are formed on a substrate (not shown). Dielectric layers 304 and sacrificial layers 306 can be alternatively deposited on the substrate to form dielectric stack 302. In some embodiments, each dielectric layer 304 includes a layer of silicon oxide, and each sacrificial layer 306 includes silicon nitride. Dielectric stack 302 can be formed by one or more thin film deposition processes including, but not limited to, chemical vapor deposition (CVD), physical vapor deposition (PVD), atomic layer deposition (ALD), or any combination thereof.

Method 400 proceeds to operation 404, as illustrated in FIG. 4, in which an opening extending vertically through the dielectric stack is formed. As illustrated in FIG. 3B, an opening 310 (channel hole) is formed extending vertically through dielectric stack 302. In some embodiments, a plurality of openings 310 are formed through dielectric stack 302 such that each opening 310 becomes the location for growing an individual NAND memory string in the later process. In some embodiments, fabrication processes to form opening 310 include wet etching and/or dry etching, such as deep-ion reactive etching (DRIE). In some embodiment, opening 310 has a nominally straight sidewall profile so that a higher number of openings can be formed for a given substrate area. This arrangement can effectively increase the density of memory cells.

Method 400 proceeds to operation 406, as illustrated in FIG. 4, in which shallow recesses are formed by removing parts of a sacrificial layer abutting a sidewall of the opening. The sacrificial layer can be at a lower portion of the dielectric stack where the semiconductor plug is to be formed at the same vertical level. The sacrificial layer can be referred to herein as a lower sacrificial layer.

Figure 3C:
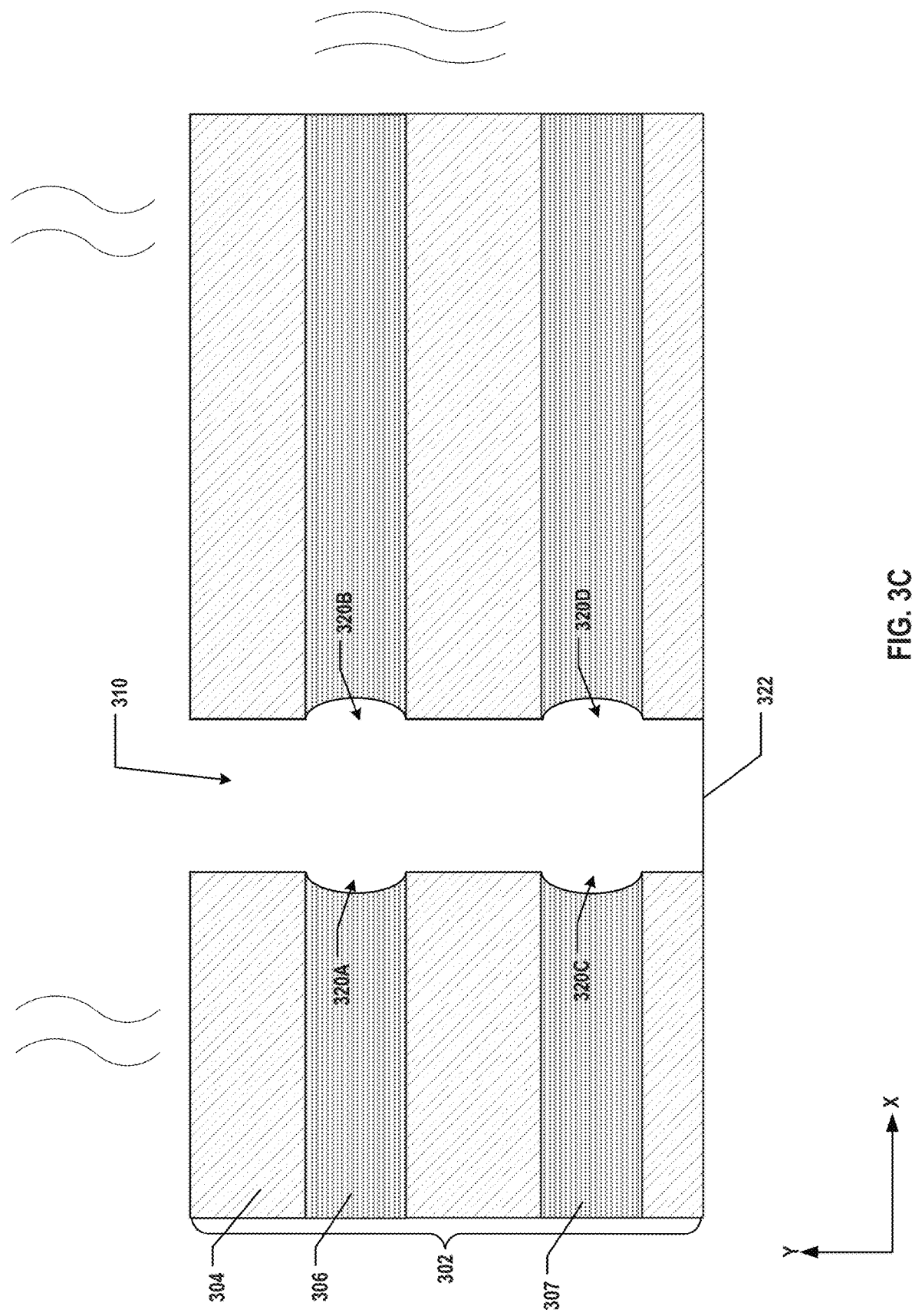
Figure 4:
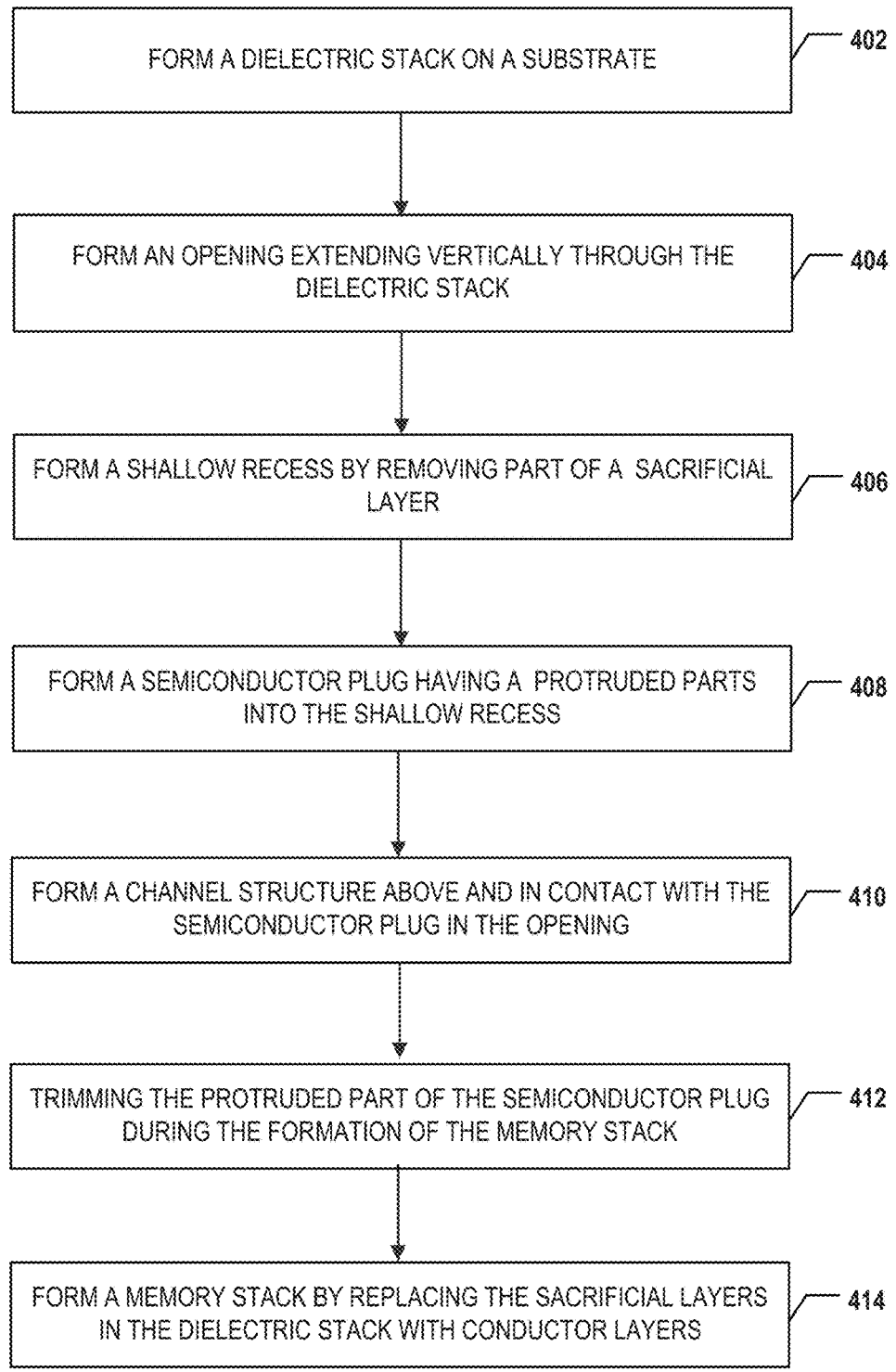
FIG. 4 is a flowchart of an exemplary method for forming a 3D memory device having a structurally-reinforced semiconductor plug, according to some embodiments of the present disclosure.

As shown in FIG. 3C, shallow recesses 320A-320D are formed laterally between sacrificial layers 306 (including a lower sacrificial layer 307) and opening 310. Shallow recesses 320A-320D can be formed by applying wet etch and/or dry etch to sacrificial layers 306 through opening 310. By controlling the etch rate and/or etch time, only parts of sacrificial layers 306 that abut the sidewall of opening 310 are etched, according to some embodiments. It is understood that the shallow recesses can be formed not only in lower sacrificial layer 307 (e.g., shallow recesses 320C and 320D), but also in other sacrificial layers in dielectric stack 302 (e.g., shallow recesses 320A and 320B). In some embodiments, a wet etchant including a mixture of hydrofluoric acid and ozone is used to form shallow recesses 320A-320D. The wet etch process, according to some embodiments, is part of a cleaning process prior to forming a semiconductor plug. The cleaning process can also serve the purpose for removing the native oxide grown from the substrate. An oxide-free surface 322 of the substrate (the bottom surface of opening 310) can thus be formed for subsequent process of forming the semiconductor plug.

In existing fabrication process of forming a semiconductor plug in a 3D memory device, the cleaning process can include multiple steps using chemical solutions including a mixture of hydrochloric acid, hydrofluoric acid, ammonia, hydrogen peroxide, ozone, or any combination therefore. The existing chemical solutions for cleaning, however, do not contribute to forming any shallow recesses due to its low etching selectivity of sacrificial layer 306 to dielectric layer 304. Therefore, the sidewall profile of opening 310 in dielectric stack 302 remains a nominally straight vertical profile before and after the cleaning process. In contrast, the cleaning process of the present disclosure uses an etchant (i.e., a mixture of hydrofluoric acid and ozone) that leads to the formation of shallow recesses 320A-320D due to its distinct etching selectivity of sacrificial layer 306 to dielectric layer 304.

The etchant used for forming shallow recesses 320A-320D can include any suitable etchant that has a selectivity between sacrificial layer 306 (e.g., silicon nitride) and dielectric layer 304 (e.g., silicon oxide) ranging from about 1 to about 50, such as from 1 to 50 (e.g., 1, 5, 10, 15, 20, 25, 30, 35, 40, 45, 50, any range bounded by the lower end by any of these values, or in any range defined by any two of these values). In some embodiments, the selectivity of the etchant ranges from about 1 to about 5, such as from 1 to 5 (e.g., 1, 1.5, 2, 2.5, 3, 3.5, 4, 4.5, 5, any range bounded by the lower end by any of these values, or in any range defined by any two of these values). In some embodiments, an exemplary etchant having the above-described selectivity range is a mixture of hydrofluoric acid and ozone. For example, the hydrofluoric acid has a concentration of 49% in the ultra-pure water. In some embodiments, the weight ratio of hydrofluoric acid to zone is between about 1:10 and about 1:50 at room temperature (e.g., about 23° C.), such as between 1:10 and 1:50 (e.g., 1:10, 1:15, 1:20, 1:25, 1:30, 1:35, 1:40, 1:45, 1:50, any range bounded by the lower end by any of these values, or in any range defined by any two of these values). Shallow recesses 320A-320D can thus be formed by applying the etchant through opening 310, which has a higher etching rate on sacrificial layer 306 and a lower etching rate on dielectric layer 304. As described above, the etchant can also serve as the cleaning solution for cleaning the sidewall and bottom surface 322 of opening 310, for example, removing the native oxide (e.g., silicon oxide) grown on bottom surface 322 of opening 310. In some embodiments, an addition cleaning process, e.g., plasma treatment using $NF_3$, is used for further remove the native oxide after the cleaning/etching process.

The extent to which sacrificial layers 306 are etched (e.g., the dimension of shallow recess 320A-320D) can be controlled by the etching rate and/or etching time of the etchant described above. The etching rate can be affected by the constituents, weight or molar ratio, and/or temperature of the etchant. In some embodiments, the etching time of the etchant for forming shallow recesses 320A-320D is between about 1 minute and about 20 minutes, such as between 1 minute and 20 minutes (e.g., 1 minute, 2 minutes, 3 minutes, 4 minutes, 5 minutes, 6 minutes, 7 minutes, 8 minutes, 9 minutes, 10 minutes, 11 minutes, 12 minutes, 13 minutes, 14 minutes, 15 minutes, 16 minutes, 17 minutes, 18 minutes, 19 minutes, 20 minutes, any range bounded by the lower end by any of these values, or in any range defined by any two of these values).

Figure 6:
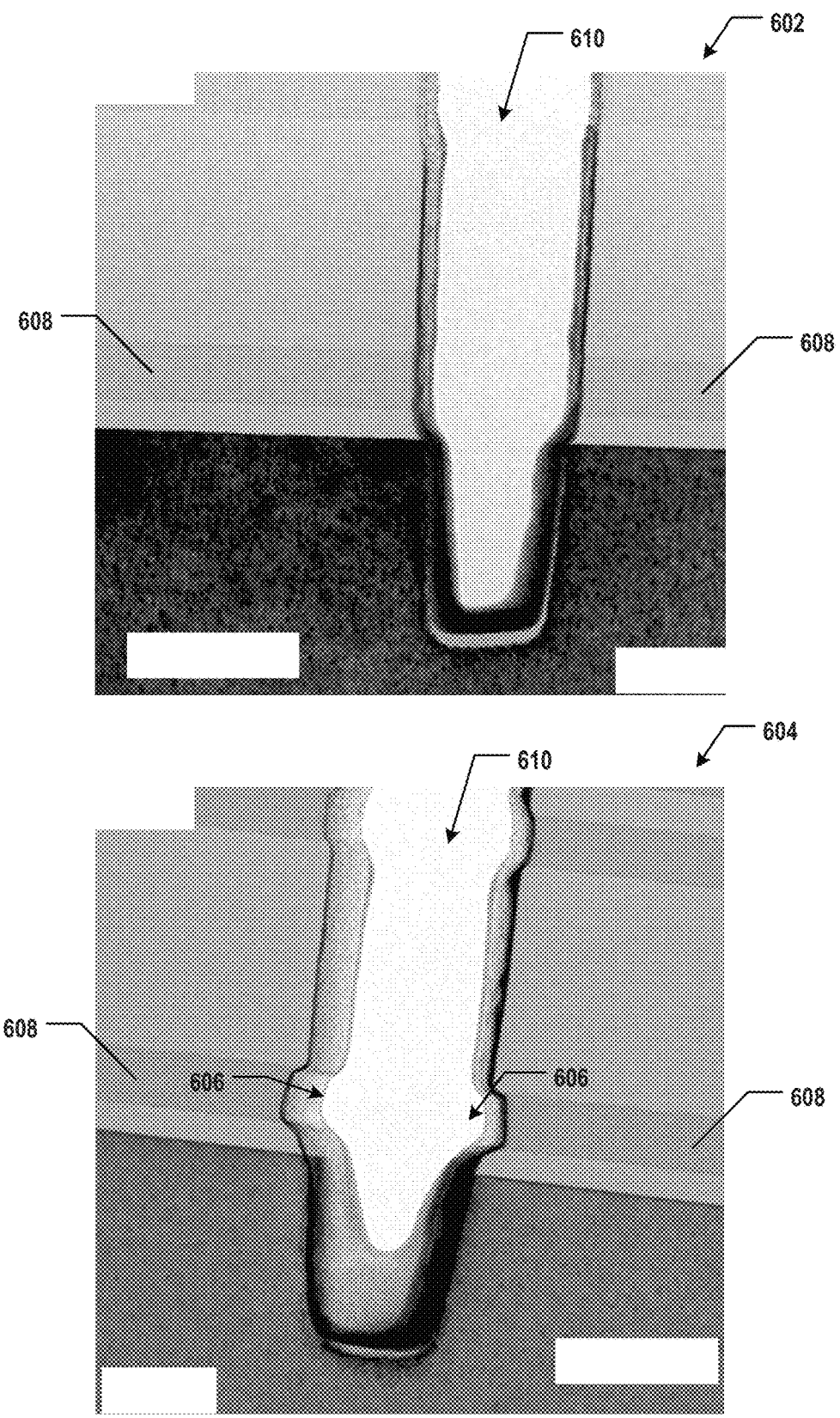
FIG. 6 depicts exemplary sidewall profiles of the lower portion of a channel hole prior to and after the formation of shallow recesses, according to some embodiments of the present disclosure.

For example, FIG. 6 depicts exemplary sidewall profiles of the lower portion of a channel hole 610 prior to and after the formation of shallow recesses 606. Comparing the scanning electronic microscope (SEM) images 602 and 604 prior to and after the cleaning/etching process, respectively, shallow recesses 606 are formed at the lower portion of channel hole 610 by removing parts of a lower sacrificial layer 608 of the dielectric stack.

Referring to FIG. 4, method 400 proceeds to operation 408, as illustrated in FIG. 4, in which a semiconductor plug with protruding parts is formed. Parts of the semiconductor plug can protrude into the shallow recesses. In some embodiments, to form the semiconductor plug, a semiconductor layer is epitaxially grown from the substrate in the opening, which fills in the shallow recesses.

Figure 3D:
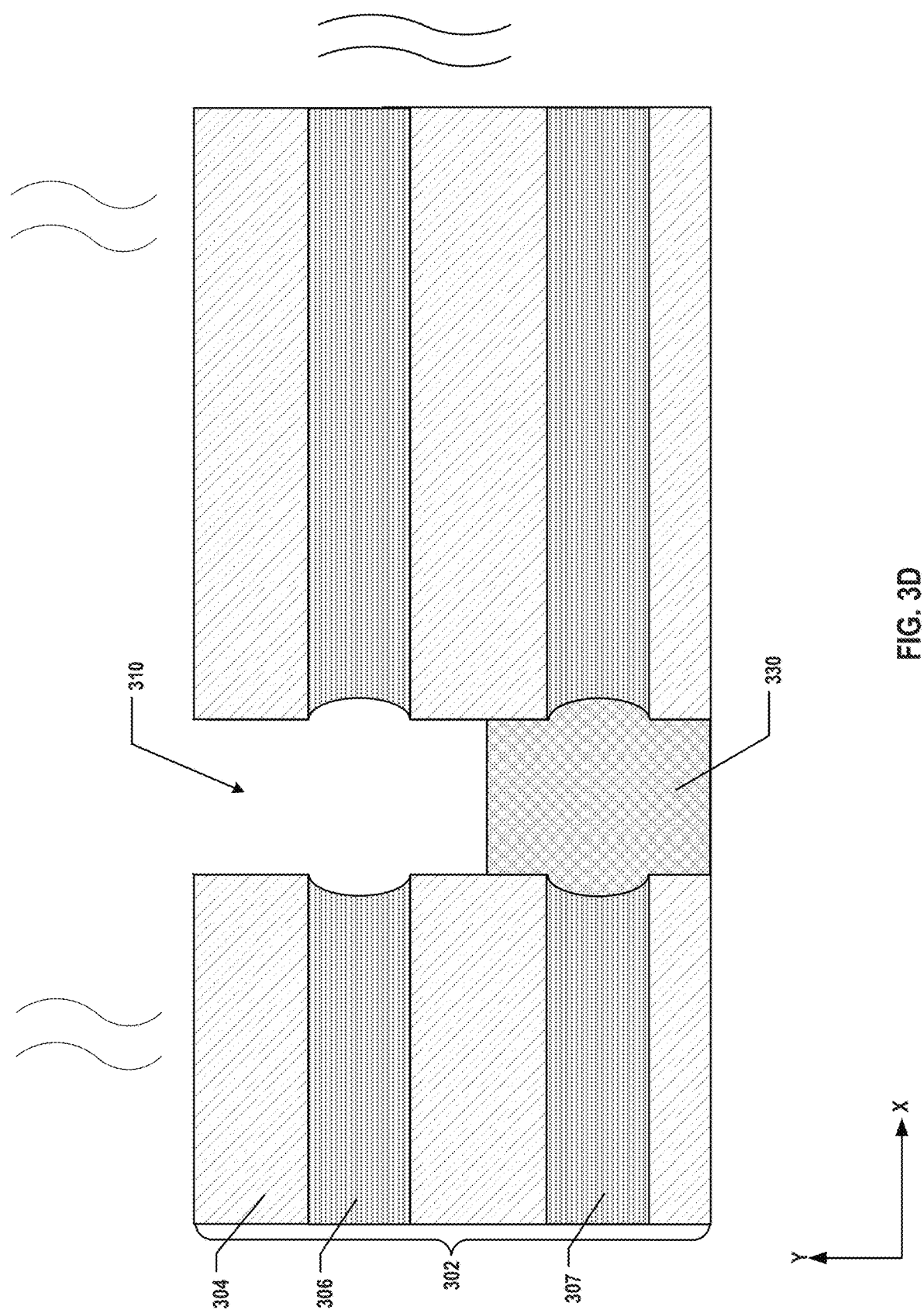

As illustrated in FIG. 3D, a semiconductor plug 330 can be formed by filling the lower portion of opening 310, as well as shallow recesses 320C and 320D (shown in FIG. 3C) in lower sacrificial layer 307 with a semiconductor material, such as silicon, which is epitaxially grown from the substrate. It is understood that in some embodiments, semiconductor plug 330 includes single crystalline silicon that is part of the substrate. In some embodiments, semiconductor plug 330 neighbors more than one sacrificial layer 306. In such cases, the number of protruding parts in semiconductor plug 330 can increase proportionally to the number of abutting sacrificial layers 306. The fabrication processes for epitaxially growing semiconductor plug 430 can include, but not limited to, vapor-phase epitaxy (VPE), liquid-phase epitaxy (LPE), molecular-beam epitaxy (MBE), or any combinations thereof.

Method 400 proceeds to operation 410, as illustrated in FIG. 4, in which a channel structure is formed above and in contact with the semiconductor plug in the opening. In some embodiments, to form the channel structure, a memory film is formed along the sidewall of the opening above the semiconductor plug, and a semiconductor channel extending vertically is formed over the memory film.

Figure 3E:
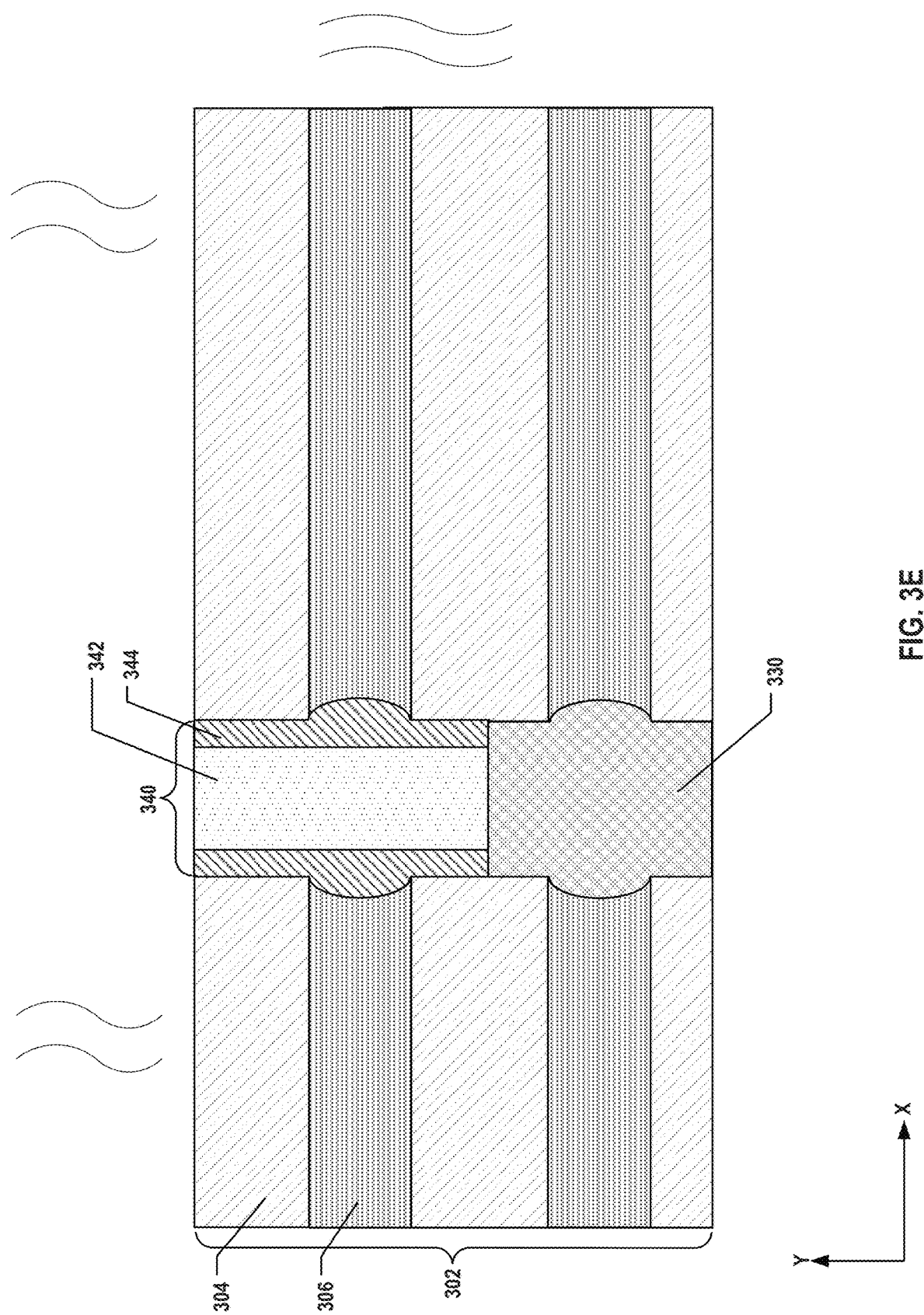

As illustrated in FIG. 3E, a channel structure 340 is formed above and in contact with semiconductor plug 330 in opening 310 (shown in FIG. 3D). Fabrication processes of forming channel structure 340 can include forming a semiconductor channel 342 and a memory film 344 disposed laterally between semiconductor channel 342 and the dielectric layer pairs of dielectric stack 302. In some embodiments, memory film 344 is first deposited along the sidewall of opening 310 above semiconductor plug 330, and semiconductor channel 342 is then deposited over memory film 344, extending vertically through dielectric stack 302. Semiconductor channel 342 can include semiconductor materials, such as polysilicon. Memory film 344 can be a composite dielectric layer, such as a combination of a tunneling layer, a storage layer, and a blocking layer (not shown). Each layer in memory film 344 can include dielectric materials including, but not limited to, silicon oxide, silicon nitride, silicon oxynitride, or any combination thereof. Semiconductor channel 342 and memory film 344 can be formed by one or more thin film deposition processes, such as ALD, CVD, PVD, any other suitable processes, or any combination thereof.

Method 400 proceeds to operation 412, as illustrated in FIG. 4, in which the protruding part of the semiconductor plug is trimmed during the formation of the memory stack. As a result, the lateral dimension of the semiconductor plug can become substantially the same along the vertical direction. In some embodiments, the variation of the lateral dimension of the semiconductor plug along the vertical direction is less than 25% after the trimming.

Figure 3F:
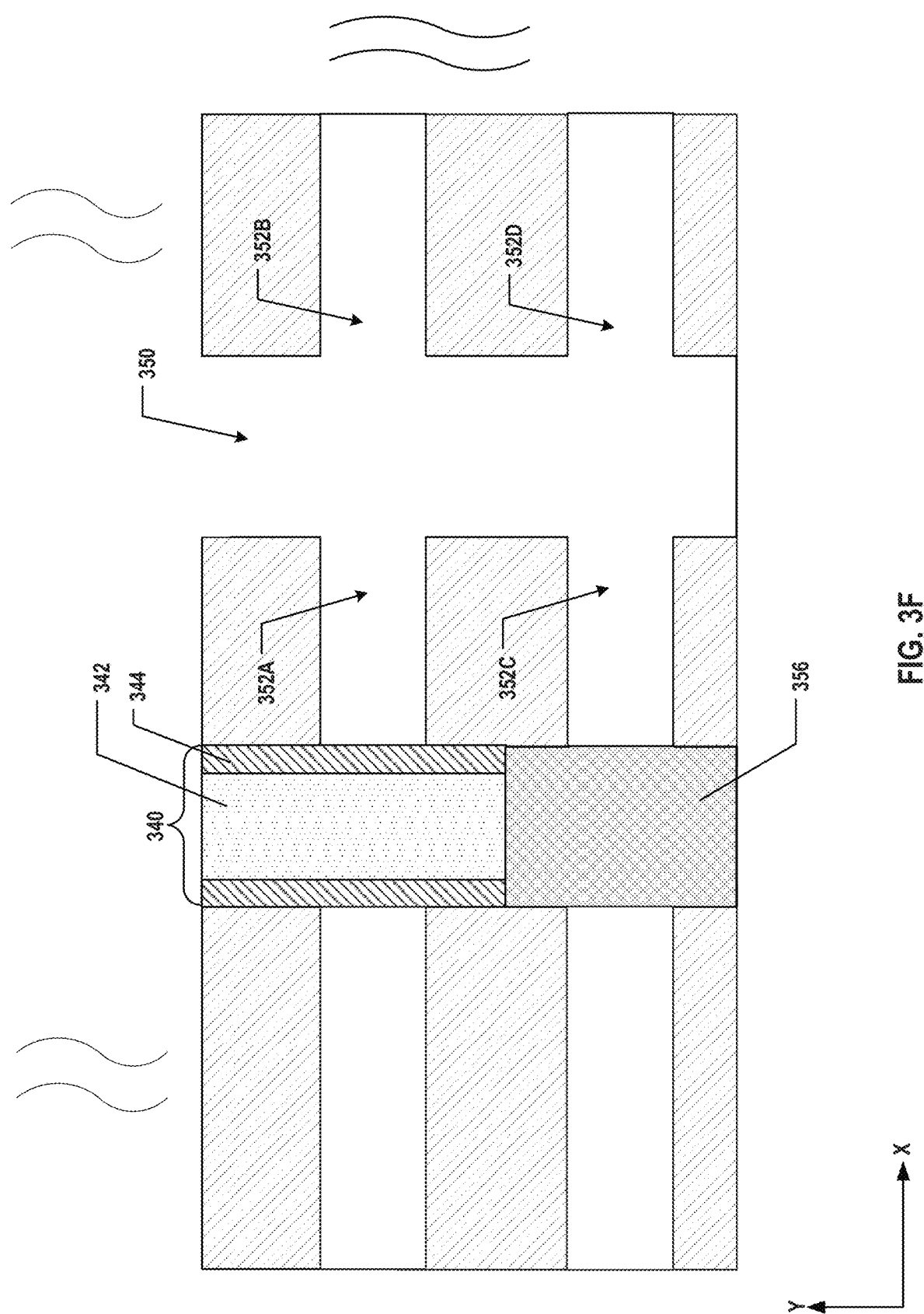

As illustrated in FIG. 3F, the trimming process is preceded by forming a slit 350 extending vertically through dielectric stack 302. Slit 350 can be formed by wet etching and/or dry etching of dielectrics (e.g., silicon oxide and silicon nitride) through dielectric stack 302. Trimming process can then be performed by applying etching solutions through slit 350, such that sacrificial layers 306 (shown in FIG. 3E) are removed, creating lateral recesses 352A, 352B, 352C, and 352D; and the protruding parts of semiconductor plug 330 are removed. In some embodiments, only the protruding parts of semiconductor plug 330 are trimmed. In some embodiments, both the protruding parts of semiconductor plug 330 and memory film 344 are trimmed. The etching solutions include phosphoric acid, which can etch sacrificial layers 306 (e.g., silicon nitride layers) as well as trims semiconductor plug 330 (e.g., silicon plug). That is, etching solutions (e.g., phosphoric acid) can etch both sacrificial layers 306 (e.g., silicon nitride layers) and semiconductor plug 330 (e.g., silicon plug) at the same time, but with different etching rates (e.g., the etching rate of sacrificial layers 306 is greater than that of semiconductor plug 330).

After trimming, a semiconductor plug 356 with substantially the same lateral dimension in the y-direction can be formed. In some embodiments, the lateral dimension of semiconductor plug 356 in the y-direction varies from about 0% to about 25%, such as from 0% to 25%, due to different etching rates across the exposed surface of semiconductor plug 356 in the y-direction. Different from the existing fabrication processes for forming 3D memory devices in which the semiconductor plug can be easily over-etched, the formation of the protruding parts of semiconductor plug 330 can act as the buffer during the trimming process to avoid over-etching and thus, ensure a substantially uniform sidewall profile of resulting semiconductor plug 356.

Method 400 proceeds to operation 414, as illustrated in FIG. 4, in which a memory stack is formed by replacing the sacrificial layers in the dielectric stack with conductor layers. The memory stack thus can include a plurality of conductor/dielectric layer pairs. In some embodiments, to form the memory stack, a slit is formed through the dielectric stack, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers. It is understood that operations 412 and 414 can be performed in a single fabrication step in which the etchant (e.g., phosphoric acid) used for removing the sacrificial layers (e.g., silicon nitride layers) can also trim the protruding parts of semiconductor plug 330 (e.g., silicon plug).

Figure 3G:
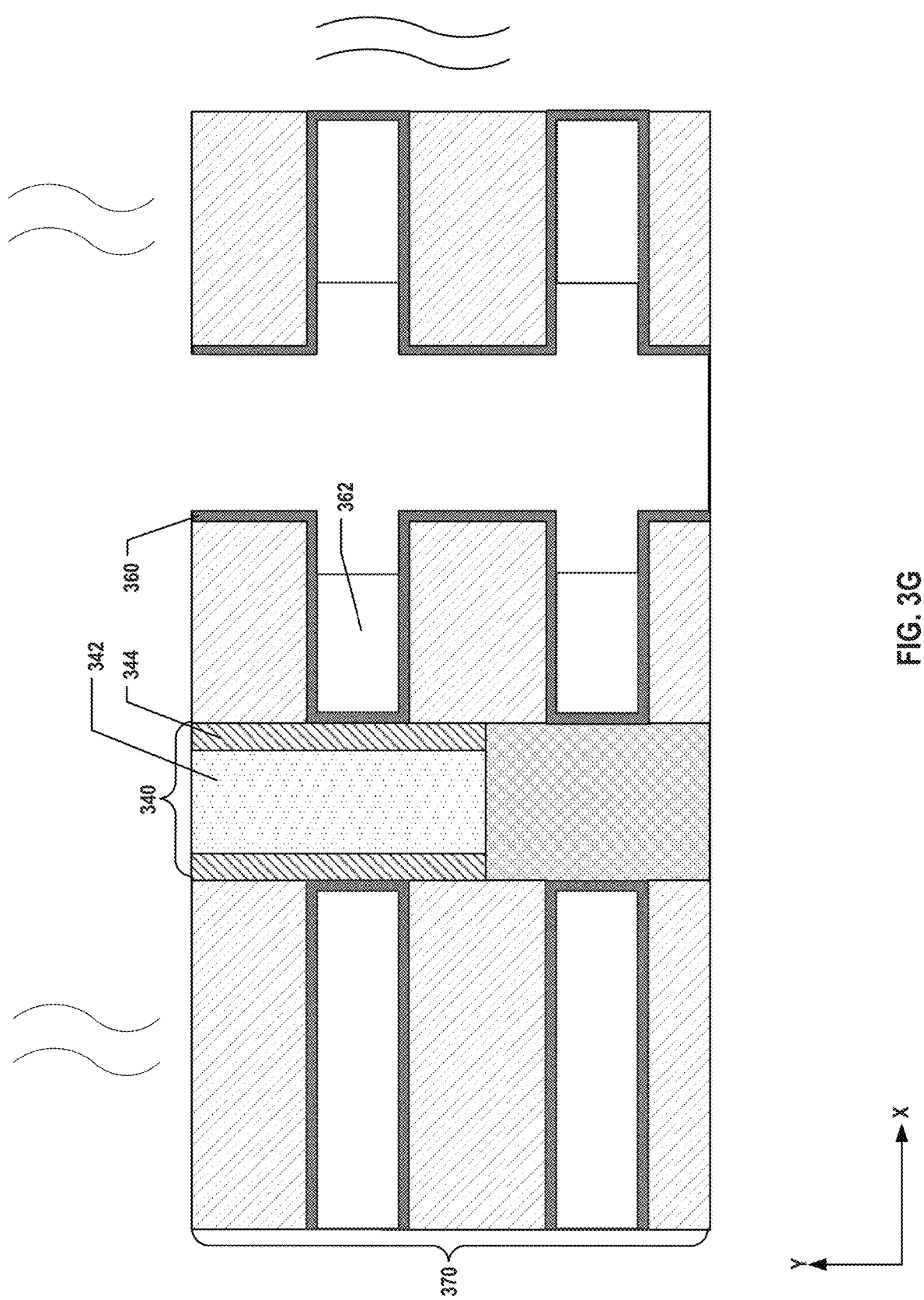

As illustrated in FIG. 3G, gate dielectric layers 360 and conductor layers 362 (gate conductors) are formed subsequently in this order along the sidewalls of slit 350 and lateral recesses 352A-352D (as shown in FIG. 3F). Conductor layers 362 are then partially removed by wet etching and/or dry etching, according to some embodiments. As a result, a memory stack 370 can be formed, replacing dielectric stack 302 by the so-called gate replacement processes. Gate dielectric layers 360 and conductor layers 362 can be formed by one or more thin film deposition processes, such as ALD, CVD, PVD, any other suitable processes, or any combination thereof. Gate dielectric layers 360 can include dielectric materials including silicon nitride, high-k dielectrics, such as aluminum oxide ($Al_2O_3$), hafnium oxide ($HfO_2$) or tantalum oxide ($Ta_2O_5$), or any combination thereof. Conductor layers 426 can include conductive materials including, not limited to, W, Co, Cu, Al, polysilicon, silicides, or any combination thereof. In some embodiments, the remaining space of slit 350 and lateral recesses 352A-352D after the gate replacement processes illustrated in FIGS. 3F-3G is filled with filling materials, such as dielectric(s) (as a spacer) and conductive materials (as an adhesion/barrier layer and a conductor), to form a slit contact (not shown) extending vertically through memory stack 370.

Figure 5:
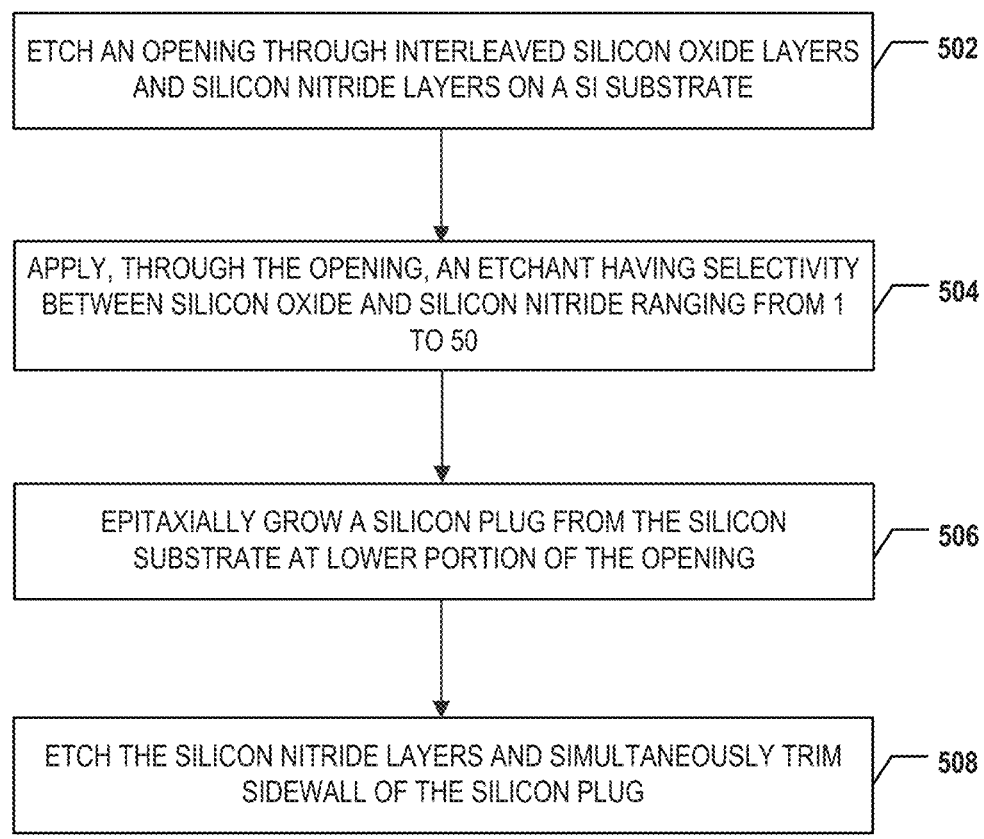
FIG. 5 is a flowchart of an exemplary method for forming a structurally-reinforced semiconductor plug in a 3D memory device, according to some embodiments of the present disclosure.

It should be understood that the application of a structurally-reinforced semiconductor plug is not limited to a 3D memory device only. A more generic device can be any semiconductor structure having a structurally-reinforced semiconductor plug. FIG. 5 is a flowchart of an exemplary method 500 for forming such a semiconductor structure with a structurally-reinforced semiconductor plug, according to some embodiments. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which an opening is formed through a dielectric stack including interleaved silicon oxide layers and silicon nitride layers on a substrate. Fabrication processes for forming the silicon oxide/silicon nitride dielectric stack and the opening are similar to those depicted with reference to FIGS. 3A-3B, and thus are not be repeated here. It should be noted that the silicon oxide layer and the silicon nitride layer function as the dielectric layer and the sacrificial layer in the dielectric stack, respectively.

Method 500 proceeds to operation 504, as illustrated in FIG. 5, in which an etchant with a selectivity ranging from about 1 to about 50 (silicon nitride to silicon oxide) is applied through the opening. In some embodiments, the selectivity can be between 1 to 50 (e.g., 1, 2, 3, 4, 5, 6, 7, 8, 9, 10, 15, 20, 25, 30, 35, 40, 45, 50, any range bounded by the lower end by any of these values, or in any range defined by any two of these values). Shallow recesses are formed by etching parts of the silicon nitride layer abutting the sidewall of the opening.

Method 500 proceeds to operation 506, as illustrated in FIG. 5, in which a silicon plug is formed from the substrate at the lower portion of the opening. The silicon plug can be epitaxially grown from the substrate and have the same material as the substrate. The shape of the finished silicon plug can be dictated by the geometry of the shallow recesses and the opening. Thus, the silicon plug can be formed with protruding parts, similar to those illustrated with reference to FIG. 3D.

Method 500 proceeds to operation 508, as illustrated in FIG. 5, in which the silicon nitride layers are etched out, and the sidewall profile of the silicon plug is trimmed, for example, by removing the protruding parts. In some embodiments, the silicon nitride layers can be etched with the silicon plug being trimmed in a single fabrication step. The etchant can include wet chemicals such as phosphoric acid. The finished silicon plug can have substantially the same lateral dimension along the vertical direction (i.e., a substantially straight sidewall profile), and the lateral dimension can be about the same size as that of the opening.

According to one aspect of the present disclosure, a method for forming a 3D memory device is disclosed. A dielectric stack is formed on a substrate. The dielectric stack includes a plurality of interleaved dielectric layers and sacrificial layers. An opening extending vertically through the dielectric stack is formed. A shallow recess is formed by removing a part of a sacrificial layer abutting a sidewall of the opening. The sacrificial layer is at a lower portion of the dielectric stack. A semiconductor plug is formed at a lower portion of the opening. A part of the semiconductor plug protrudes into the shallow recess. A channel structure is formed above and in contact with the semiconductor plug in the opening. A memory stack including a plurality of conductor/dielectric layer pairs is formed by replacing, with a plurality of conductor layers, the sacrificial layers in the dielectric stack.

In some embodiments, the protruding part of the semiconductor plug is trimmed during the formation of the memory stack, such that a lateral dimension of the semiconductor plug becomes substantially the same along a vertical direction. A variation of the lateral dimension of the semiconductor plug along the vertical direction is less than 25% after the trimming, according to some embodiments.

In some embodiments, the substrate includes silicon, and each of the sacrificial layers includes silicon nitride. In some embodiments, to form the shallow recess, an etchant having a selectivity between silicon nitride and silicon oxide ranging from about 1 to about 50 is applied through the opening. The selectivity of the etchant ranges is from about 1 to about 5, according to some embodiments. The etchant can include hydrofluoric acid and ozone. In some embodiment, a weight ratio of hydrofluoric acid to ozone is between about 1:10 and about 1:50.

In some embodiments, to form the semiconductor plug, a semiconductor layer is epitaxially grown from the substrate in the opening.

In some embodiments, to form the channel structure, a memory film is formed along the sidewall of the opening above the semiconductor plug, and a semiconductor channel extending vertically is formed over the memory film.

In some embodiments, to form the memory stack, a slit through the dielectric stack, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers. In some embodiments, to etch the sacrificial layers, an etchant including phosphoric acid is applied through the opening.

According to another aspect of the present disclosure, a method for forming a semiconductor structure is disclosed. A plurality of interleaved dielectric layers and sacrificial layers are formed on a substrate. An opening extending vertically through the interleaved dielectric layers and sacrificial layers is formed. A shallow recess is formed by removing a part of one of the sacrificial layers abutting a sidewall of the opening. A semiconductor plug is formed at a lower portion of the opening. A part of the semiconductor plug protrudes into the shallow recess. The protruding part of the semiconductor plug is trimmed such that a lateral dimension of the semiconductor plug becomes substantially the same along a vertical direction.

In some embodiments, the sacrificial layers are removed during the trimming of the protruding part of the semiconductor plug. A variation of the lateral dimension of the semiconductor plug along the vertical direction is less than 25% after the trimming, according to some embodiments.

In some embodiments, the substrate includes silicon, and each of the sacrificial layers includes silicon nitride. In some embodiments, to form the shallow recess, an etchant having a selectivity between silicon nitride and silicon oxide ranging from about 1 to about 50 is applied through the opening. The selectivity of the etchant ranges is from about 1 to about 5, according to some embodiments. The etchant can include hydrofluoric acid and ozone. In some embodiment, a weight ratio of hydrofluoric acid to ozone is between about 1:10 and about 1:50.

In some embodiments, to form the semiconductor plug, a semiconductor layer is epitaxially grown from the substrate in the opening.

In some embodiments, to form the channel structure, a memory film is formed along the sidewall of the opening above the semiconductor plug, and a semiconductor channel extending vertically is formed over the memory film.

In some embodiments, to form the memory stack, a slit through the dielectric stack, the sacrificial layers in the dielectric stack are etched through the slit to form a plurality of lateral recesses, gate dielectric layers are deposited along sidewalls of the slit and the lateral recesses, and the conductor layers are deposited over the gate dielectric layers. In some embodiments, to etch the sacrificial layers, an etchant including phosphoric acid is applied through the opening.

According to still another aspect of the present disclosure, a 3D memory device includes a substrate, a memory stack disposed on the substrate and including a plurality of conductor/dielectric layer pairs, and a plurality of memory strings each extending vertically through the memory stack and including a semiconductor plug at a bottom portion of the memory string. A lateral dimension of the semiconductor plug is substantially the same along a vertical direction.

In some embodiments, a variation of the lateral dimension of the semiconductor plug along the vertical direction is less than 25%.

In some embodiments, the semiconductor plug includes an epitaxially-grown semiconductor layer that is the same as a material of the substrate.

In some embodiments, each of the memory strings further includes a semiconductor channel extending vertically through the conductor/dielectric layer pairs and a memory film disposed laterally between the conductor/dielectric layer pairs and the semiconductor channel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a dielectric stack on a substrate, the dielectric stack comprising a plurality of interleaved dielectric layers and sacrificial layers, the sacrificial layers each being deposited under a same deposition condition;
    forming an opening extending vertically through the dielectric stack;
    forming a shallow recess by removing a part of a sacrificial layer abutting a sidewall of the opening, the sacrificial layer being at a lower portion of the dielectric stack;
    forming a semiconductor plug at a lower portion of the opening, wherein a part of the semiconductor plug protrudes into the shallow recess;
    forming a channel structure above and in contact with the semiconductor plug in the opening;
    removing the protruding part of the semiconductor plug; and
    forming a memory stack comprising a plurality of conductor/dielectric layer pairs by replacing, with a plurality of conductor layers, the sacrificial layers in the dielectric stack.

2. The method of claim 1, wherein after removing the protruding part of the semiconductor plug, a lateral dimension of the semiconductor plug becomes substantially the same along a vertical direction.

3. The method of claim 2, wherein removing the protruding part of the semiconductor plug comprises an etching process.

4. The method of claim 2, wherein a variation of the lateral dimension of the semiconductor plug along the vertical direction is less than 25% after removing the protruding part of the semiconductor plug.

5. The method of claim 1, wherein the substrate comprises silicon, and each of the sacrificial layers comprises silicon nitride.

6. The method of claim 5, wherein forming the shallow recess comprises applying, through the opening, an etchant having a selectivity between silicon nitride and silicon oxide that is greater than 1.

7. The method of claim 6, wherein the etchant comprises hydrofluoric acid and ozone.

8. The method of claim 7, where a weight ratio of hydrofluoric acid to ozone is between about 1:10 and about 1:50.

9. The method of claim 1, wherein forming the semiconductor plug comprises epitaxially growing a semiconductor layer from the substrate in the opening.

10. The method of claim 1, wherein forming the channel structure comprises:
    forming a memory film along the sidewall of the opening above the semiconductor plug; and
    forming a semiconductor channel extending vertically over the memory film.

11. The method of claim 1, wherein forming the memory stack comprises:
    forming a slit through the dielectric stack;
    etching the sacrificial layers in the dielectric stack through the slit to form a plurality of lateral recesses;
    depositing gate dielectric layers along sidewalls of the slit and the lateral recesses; and
    depositing the conductor layers over the gate dielectric layers.

12. The method of claim 11, wherein etching the sacrificial layers comprises applying an etchant comprising phosphoric acid through the opening.

13. A method for forming a semiconductor structure, comprising:
    forming a plurality of interleaved dielectric layers and sacrificial layers on a substrate;
    forming an opening extending vertically through the interleaved dielectric layers and sacrificial layers;
    forming a shallow recess by removing a part of one of the sacrificial layers abutting a sidewall of the opening;
    forming a semiconductor plug at a lower portion of the opening, wherein a part of the semiconductor plug protrudes into the shallow recess;
    trimming the protruding part of the semiconductor plug such that a lateral dimension of the semiconductor plug becomes substantially the same along a vertical direction; and
    removing the sacrificial layers during the trimming of the protruding part of the semiconductor plug.

14. The method of claim 13, wherein the substrate comprises silicon, and each of the sacrificial layers comprises silicon nitride.

15. The method of claim 14, wherein forming the shallow recess comprises applying, through the opening, an etchant having a selectivity between silicon nitride and silicon oxide ranging from about 1 to about 50.

16. The method of claim 15, wherein the etchant comprises hydrofluoric acid and ozone.

17. The method of claim 13, wherein forming the semiconductor plug comprises epitaxially growing a semiconductor layer from the substrate in the opening.

18. A method for forming a semiconductor structure, comprising:
- forming a plurality of interleaved dielectric layers and sacrificial layers on a substrate;
- forming an opening extending vertically through the interleaved dielectric layers and sacrificial layers;
- forming a shallow recess by removing a part of one of the sacrificial layers, abutting a sidewall of the opening;
- forming a semiconductor plug at a lower portion of the opening, wherein a part of the semiconductor plug protrudes into the shallow recess; and
- trimming the protruding part of the semiconductor plug by etching away the protruding part such that a lateral dimension of the semiconductor plug becomes substantially the same along a vertical direction.

19. The method of claim 18, wherein forming the shallow recess comprises applying, through the opening, an etchant having a selectivity between silicon nitride and silicon oxide ranging from about 1 to about 50.

20. The method of claim 19, wherein the selectivity of the etchant ranges from about 1 to about 5.

* * * * *